United States Patent
Lu et al.

(10) Patent No.: US 10,608,540 B1
(45) Date of Patent: Mar. 31, 2020

(54) SMART POWER SUPPLY SYSTEM AND METHOD THEREOF

(71) Applicant: MOXA INC., New Taipei (TW)

(72) Inventors: Wei-Chun Lu, New Taipei (TW); Ting-Ta Yu, New Taipei (TW)

(73) Assignee: Moxa Inc., New Taipei (TW)

( * ) Notice: Subject to any disclaimer, the term of this patent is extended or adjusted under 35 U.S.C. 154(b) by 0 days.

(21) Appl. No.: 16/167,550

(22) Filed: Oct. 23, 2018

(51) Int. Cl.
 *H02M 3/335* (2006.01)
 *H02M 1/36* (2007.01)

(52) U.S. Cl.
 CPC ......... *H02M 3/33515* (2013.01); *H02M 1/36* (2013.01)

(58) Field of Classification Search
 CPC ......... H02M 3/157; H02M 1/44; H02M 7/217
 See application file for complete search history.

(56) References Cited

U.S. PATENT DOCUMENTS

| | | | |
|---|---|---|---|
| 8,125,200 B2 * | 2/2012 | Tsai | H02M 3/1584 323/267 |
| 9,912,224 B2 * | 3/2018 | Shiu | H02M 1/32 |
| 2015/0039152 A1 * | 2/2015 | Uchikawa | H02J 13/0096 700/297 |

* cited by examiner

*Primary Examiner* — Fred E Finch, III
*Assistant Examiner* — Rafael O. De León Domenech
(74) *Attorney, Agent, or Firm* — Winston Hsu

(57) ABSTRACT

A smart power supply system is provided. An input end connecting to a power supply provides power to a control module, so that the control module can receive an application voltage range from an electronic product, and then control a power module according to the application voltage range to make an output voltage value of an output end increased gradually according to the application voltage range from low to high. In the process that the output voltage value of the output end is increased gradually, the control module detects an input voltage value and an input current value and the output voltage value to calculate and store an input power correspondingly, and then control the power module according to the output voltage value, which corresponds to the minimum input power of the stored input powers to make the output voltage value of the output end be an optimum voltage value.

10 Claims, 3 Drawing Sheets

SMART POWER SUPPLY SYSTEM AND METHOD THEREOF

BACKGROUND OF THE RELATED ART

Technical Field

The present invention relates to a power supply system and method thereof, more specifically it relates to a smart power supply system and method thereof.

Related Art

In addition to the lighter and simpler electronic products using dry batteries, most electronic products use power supplies or transformers to obtain power. Most of the power supplies or transformers convert alternating current (AC) power from the supply mains to direct current (DC) power. Then, through filtering and voltage conversion steps, a stable DC voltage is generated to provide power to the electronic products.

With the development of environmental protection concepts, in the field of power supply technology, improving power efficiency is an important tendency. The conventional power supply system uses the structure and selected components to improve the power efficiency. Therefore, the output voltage of the power supply cannot be automatically adjusted for different electronic products, so that the overall efficiency of the power supply cannot be further improved.

In summary, it can be seen that there is a problem in the prior art that the power supply cannot automatically adjust the output voltage for different electronic products. Therefore, it is necessary to propose an improved technical solution to solve this problem.

SUMMARY

In order to solve aforementioned problem, the present invention discloses a smart power supply system and method thereof.

The smart power supply system of the present invention includes an input end, a power module, an output end, and a control module, wherein the power module connects to the input end, the output end connects to the power module, and the control module connects to the input end, the power module, and the output end. The input end connects to a power source to supply power; and the control module receives the power to receive an application voltage range from an electronic product, and controls the power module according to the application voltage range to make an output voltage value of the output end increased gradually according to the application voltage range from low to high. In the process that the output voltage value of the output end is increased gradually from low to high, the control module detects an input voltage value and an input current value of the input end and the output voltage value of the output end to calculate an input power correspondingly, and sequentially stores the output voltage value and the input power corresponding thereto. After the output voltage value of the output end is the maximum of the application voltage range and the control module stores the output voltage value and the input power corresponding thereto, the control module controls the power module according to the output voltage value, which corresponds to the minimum input power of the stored input powers to make the output voltage value of the output end be an optimum voltage value.

The present invention further provides a smart power supply method includes following steps: providing a smart power supply system, including an input end, a power module, an output end, and a control module, wherein the input end connects to the power module, the power module connects to the output end, and the control module connects to the input end, the power module, and the output end; connecting the input end to a power source to supply power to the control module; receiving, by the control module, an application voltage range from an electronic product, and controlling the power module according to the application voltage range to make an output voltage value of the output end increased gradually according to the application voltage range from low to high; detecting, by the control module, an input voltage value and an input current value of the input end and the output voltage value of the output end to calculate an input power correspondingly, and sequentially storing, by the control module, the output voltage value and the input power corresponding thereto in the process that the output voltage value of the output end is increased gradually from low to high; and controlling, by the control module, the power module according to the output voltage value, which corresponds to the minimum input power of the stored input powers to make the output voltage value of the output end be an optimum voltage value, after the output voltage value of the output end being the maximum of the application voltage range and the control module storing the output voltage value and the input power corresponding thereto.

The system and method disclosed in the present invention are as above, and the difference from the prior art is that the control module controls the power module according to the application voltage range transmitted from the electronic product to gradually increase the output voltage value; and during the process, the control module detects the input voltage value, the input current value and the output voltage value, calculates the input power, and stores the output voltage value and the input power corresponding thereto; and then the control module controls the power module according to the output voltage value, which corresponds to the minimum input power of the stored input powers to make the output voltage value of the output end be the optimum voltage value.

By aforementioned technology means, the present invention can achieve technical efficiency in reducing waste heat and saving energy costs.

BRIEF DESCRIPTION OF THE DRAWINGS

The invention will become more fully understood from the detailed description given herein below illustration only, and thus is not limitative of the present invention, and wherein.

DETAILED DESCRIPTION

Figure 1:
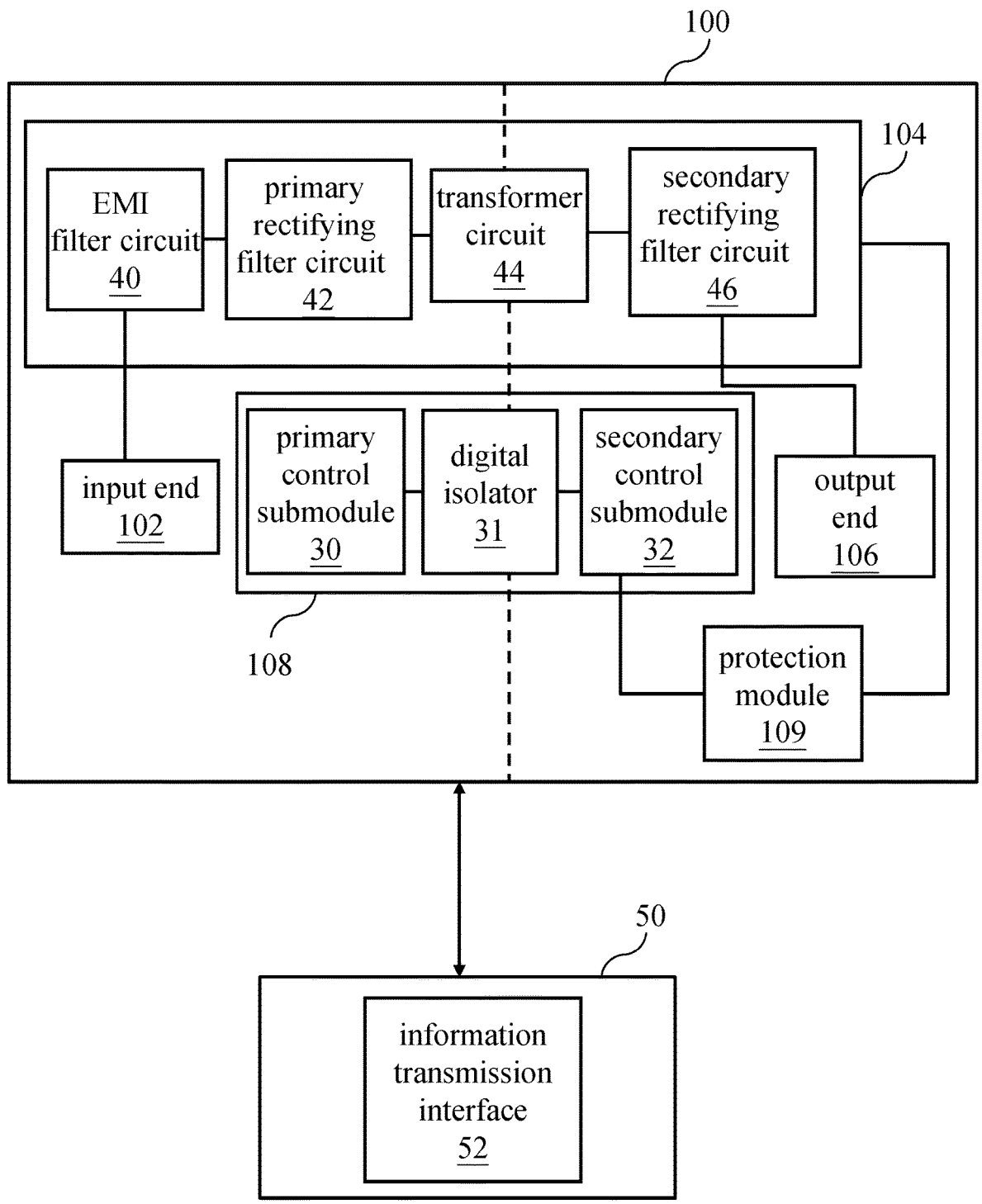
FIG. 1 is a system block diagram of an embodiment of a smart power supply system of the present invention.

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proparts and ratios of elements in the drawings may be exaggerated or diminished in size for the sake of clarity and convenience. Such arbitrary proparts are only illustrative and not limiting in any way. The same reference numbers are used in the drawings and description to refer to the same or like parts.

Figure 2:
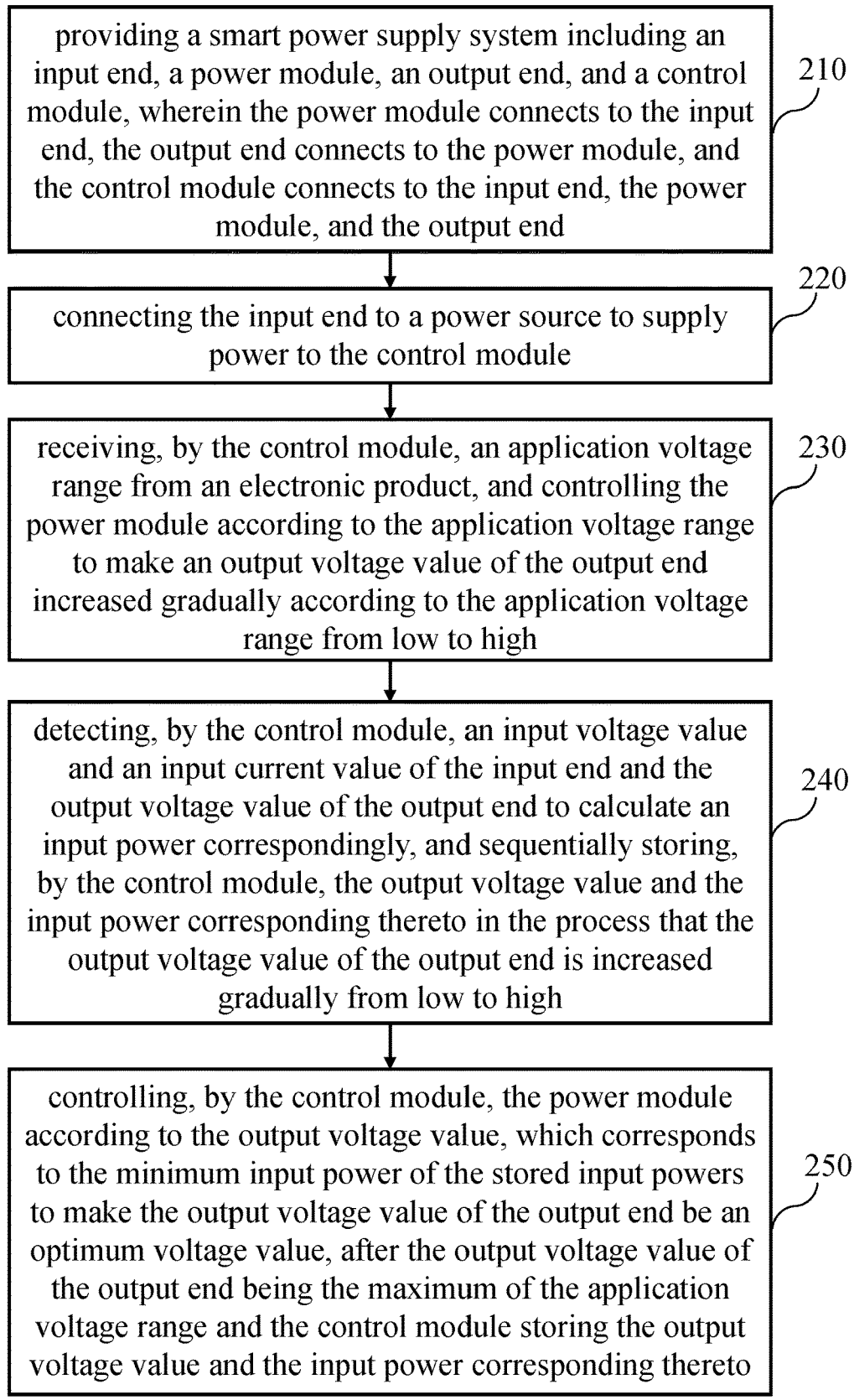
FIG. 2 is a flow chart of a smart power supply method implemented by the smart power supply system of FIG. 1.

The following is a description of a smart power supply system disclosed in the present invention. Please refer to FIG. 1 to FIG. 2, wherein FIG. 1 is a system block diagram of an embodiment of a smart power supply system of the present invention; and FIG. 2 is a flow chart of a smart power supply method implemented by the smart power supply system of FIG. 1. The smart power supply system 100 includes an input end 102, a power module 104, an output end 106, and a control module 108, wherein the power module 104 connects to the input end 102, the output end 106 connects to the power module 104, and the control module 108 connects to the input end 102, the power module 104, and the output end 106 (that is, step 210). The power module 104 can include an electromagnetic interference (EMI) filter circuit 40, a primary rectifying filter circuit 42, a transformer circuit 44 and a secondary rectifying filter circuit 46, wherein the EMI filter circuit 40 is connected to the input end 102, the primary rectifying filter circuit 42 is connected to the EMI filter circuit 40, and the transformer circuit 44 is connected to the primary rectifying filter circuit 42, and the secondary rectifying filter circuit 46 is connected to the transformer circuit 44.

In this embodiment, the smart power supply method performed by the smart power supply system 100 may include the following steps: connecting the input end to a power source to supply power to the control module (step 220); receiving, by the control module, an application voltage range from an electronic product, and controlling the power module according to the application voltage range to make an output voltage value of the output end increased gradually according to the application voltage range from low to high (step 230); detecting, by the control module, an input voltage value and an input current value of the input end and the output voltage value of the output end to calculate an input power correspondingly, and sequentially storing, by the control module, the output voltage value and the input power corresponding thereto in the process that the output voltage value of the output end is increased gradually from low to high (step 240); and controlling, by the control module, the power module according to the output voltage value, which corresponds to the minimum input power of the stored input powers to make the output voltage value of the output end be an optimum voltage value, after the output voltage value of the output end being the maximum of the application voltage range and the control module storing the output voltage value and the input power corresponding thereto (step 250).

In step 220, the input end 102 can be connected to the supply mains or general DC power source (that is, the power source, not drawn) to provide power to the control module 108, so that the control module 108 can perform the subsequent step 230 to step 250. In step 230, when the smart power supply system 100 is connected to the electronic product 50, the control module 108 can receive the application voltage range from the electronic product 50, and control the power module 104 according to the application voltage range to make the output voltage value of the output end 106 gradually increased from low to high. In more detail, when the control module 108 obtains power from the input end 102, it can detect whether the smart power supply system 100 is connected to the electronic product 50, and if the control module 108 detects that the smart power supply system 100 is connected to the electronic product 50, the control module 108 can further detect whether the electronic product 50 has an information transmission interface 52; and if the control module 108 detects that the electronic product 50 has the information transmission interface 52, the control module 108 can obtain the application voltage range of the electronic product 50 from the electronic product 50 via the information transmission interface 52, but this embodiment is not intended to limit the invention.

For example, when the smart power supply system 100 is connected to the electronic product 50, the electronic product 50 can transmit the application voltage range thereof to the control module 108 via the information transmission interface 52. The information transmission interface 52 can be, but not limited to, a universal asynchronous receiver/transmitter (UART) or an inter-integrated circuit ($I^2C$). In other words, there is a storage unit built in the electronic product 50 for storing the application voltage range of the electronic product 50 (that is, the voltage range for the electronic product 50). When the control module 108 detects that the electronic product 50 has the information transmission interface 52, the electronic product 50 is passive, and the application voltage range stored by the electronic product 50 is obtained by the control module 108 via the information transmission interface 52; or when the smart power supply system 100 is connected to the electronic product 50, the electronic product 50 can actively transmit the stored application voltage range to the control module 108.

After the control module 108 receives the application voltage range from the electronic product 50, the control module 108 can control the power module 104 according to the application voltage range, so that the output voltage value of the output end 106 is raised from low to high within the application voltage range gradually. The output voltage value of the output end 106 can be adjusted by equal spacing or unequal spacing, and the spacing can be, but not limited to, 0.1 voltage (V), which can be adjusted according to actual needs. In the embodiment, the method for controlling the power module 104 according to the application voltage range, which is used by the control module 108, is referred to the following description. In this embodiment, since the power received by the input end 102 is AC (that is, the supply mains), the EMI filter circuit 40 can be used to receive an AC signal from the power source and filter out noise of the AC signal to suppress the influence on the electronic product 50 caused by the high frequency interference in the AC signal; the primary rectifying filter circuit 42 can be used for rectifying and filtering the AC signal from the EMI filter circuit 40 to output a DC signal, and adjusting the DC signal according to the pulse width modulation (PWM) signal, which can be adjusted according to the application voltage range, output by the control module 108 to transmit a primary voltage signal to the transformer circuit 44; and the transformer circuit 44 can be used to perform a transformer program (that is, boost or buck) on the primary voltage signal to output a secondary voltage signal; and the secondary rectifying filter circuit 46 can be used for rectifying and filtering the secondary voltage signal from the transformer circuit 44 according to the control of the control module 108 (that is, the adjustment based on the application voltage range) to output a specific signal (that is, the expected output voltage value output by the output end 106, that falls within the application voltage range) to the output end 106 for output by the output end 106.

The primary rectifying filter circuit 42 may comprise a bridge rectifier, a filter capacitor and a transistor switch unit, the bridge rectifier is connected to the filter capacitor, the filter capacitor is connected to the transistor switch unit, and the bridge rectifier can be used to rectify the AC signal from the EMI filter circuit 40; the filter capacitor can be used to filter the rectified AC signal (that is, smoothing the waveform of the rectified AC signal) to output the DC signal; and the transistor switch unit can be switched on or switched off according to the PWM signal outputted by the control module 108 to convert the DC signal into the primary voltage signal. However, this embodiment is not intended to limit the present invention, and may be adjusted according to actual conditions.

For example, the power received by the input end 102 can be direct current. Therefore, the EMI filter circuit 40 can be used to receive a DC signal from the power source and filter out the noise of the DC signal to reduce the source of electromagnetic interference; and the primary rectifying filter circuit 42 can be used for rectifying and filtering the DC signal from the EMI filter circuit 40, and adjusting the DC signal according to the PWM signal, which can be adjusted according to the application voltage range, output by the control module 108 to transmit the primary voltage signal to the transformer circuit 44; and the transformer circuit 44 can be used to perform a transformer program (that is, boost or buck) on the primary voltage signal from the primary rectifying filter circuit 42 to output the secondary voltage signal; and the secondary rectifying filter circuit 46 can be used to rectify and filter the secondary voltage signal from the transformer circuit 44 according to the control of the control module 108 (that is, the adjustment based on the application voltage range) to output a specific signal (that is, the expected output voltage value output by the output end 106, that falls within the application voltage range) to the output end 106 for output by the output end 106.

In step 240, the control module 108 can detect the input voltage value and the input current value of the input end 102 and the output of the output end 106 and calculate the input power corresponding thereto, and sequentially store the output voltage value and the input power corresponding thereto during the process that the output voltage value is gradually increased from low to high according to the application voltage range. The input power is the product of the input voltage and the input current.

In this embodiment, since the smart power supply system 100 can be, but is not limited to, an isolated power supply device, the control module 108 can include a primary control submodule 30, a digital isolator 31 and a secondary control submodule 32. The primary control submodule 30 is configured to detect the input voltage value and the input current value of the input end 102 and control the power module 104 to further control the output voltage value of the output end 106. The secondary control submodule 32 is configured to detect the output voltage value of the output end 106 and transmit the application voltage range from the electronic product 50 to the digital isolator 31. The digital isolator 31 digitizes the application voltage range and transmits the digitized application voltage range to the primary control submodule 30.

Figure 3:
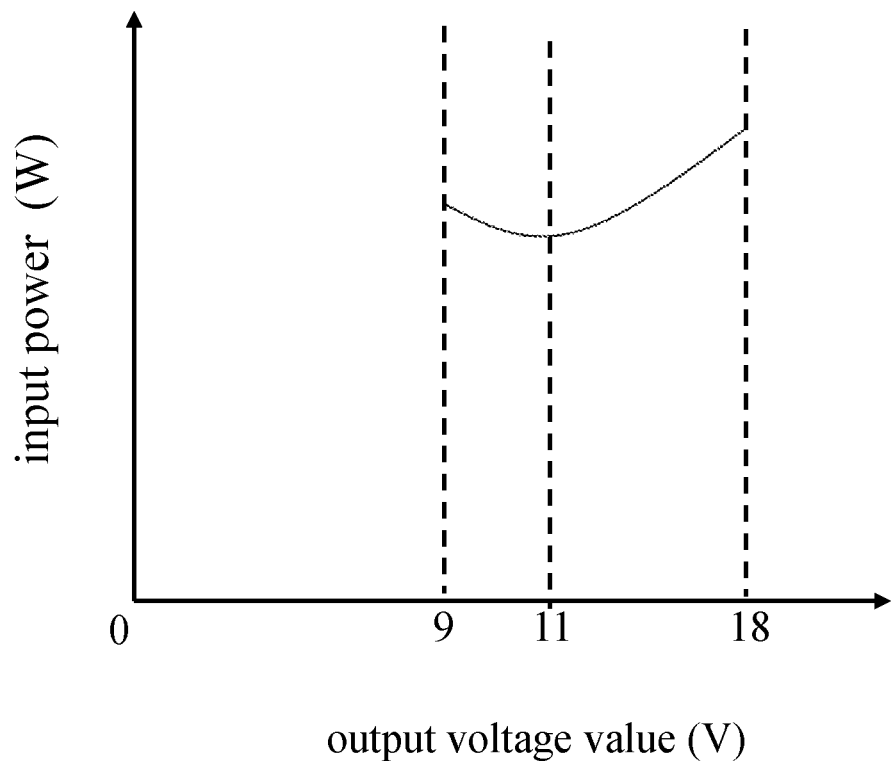
FIG. 3 is a graph showing an embodiment of a relationship between the input power and output voltage values of the smart power supply system of FIG. 1.

In step 250, after the output voltage value is the maximum value of the application voltage range and the control module 108 stores the output voltage value (that is, the maximum value of the application voltage range) and the input power corresponding thereto, the control module 108 controls the power module 104 according to the output voltage value corresponding to the minimum input power of the stored input powers, so that the output voltage value of the output end 106 is an optimum voltage value, and then the output voltage value of the output end 106 is maintained to be the optimum voltage value, thereby achieving the technical effect of reducing waste heat and saving energy costs. For details, please refer to FIG. 3, wherein FIG. 3 is a graph showing an embodiment of a relationship between the input power and output voltage values of the smart power supply system of FIG. 1, where the horizontal axe represents the output voltage value, the vertical axe represents the input power, and the unit of the input power is watts (W). As can be seen from FIG. 3, the application voltage range of this embodiment can be 9V to 18V (that is, the minimum value of the output voltage value is 9V, and the maximum value is 18V). According to different output voltage values, the smart power supply system 100 has different input power. When the output voltage value is 11V, the smart power supply system 100 has the minimum input power. Therefore, the control module 108 controls the power module 104 according to the output voltage value corresponding to the minimum input power (that is, 11 V), so that the output voltage value of the output end 106 is an optimum voltage value (that is, 11 V), and the output voltage value of the output end 106 is maintained as the optimum voltage value (that is, 11 V). It should be noted that the control module 108 does not need to plot the graph showing the relationship between the input power and the output voltage value in the process of finding the minimum input power. For the convenience of explaining how the control module 108 finds the optimal voltage value, the graph showing the relationship between the input power and the output voltage value is illustrated.

In addition, the smart power supply system 100 may further include a protection module 109, which is connected to the power module 104 and the control module 108. When the protection module 109 detects that the power module 104 is in an abnormal state, it transmits an abnormal signal to the control module 108. The control module 108 shut down the power module 104 for a certain period of time (that is, the power module 104 cannot operate in the certain period of time. In this embodiment, the control module 108 can control the power module 104 through the PWM signal to make the power module 104 inoperable). After the certain period of time passes, the protection module 109 detects whether the power module 104 is still in the abnormal state, and if yes, the protection module 109 transmits the abnormal signal to the control module 108, so that the control module 108 shuts down the power module for another certain period of time; if not, the recovery signal is transmitted to the control module 108, so that the control module 108 turns on the power module 104 (in this embodiment, the control module 108 can control the power module 104 through the PWM signal to make the power module 104 restored to operate), so that the smart power supply system 100 supplies power to the electronic product 50. The abnormal state may be, but not limited to, an overtemperature state or an overcurrent state.

In summary, it can be seen that the difference between the present invention and the prior art is that the control module controls the power module according to the application voltage range transmitted from the electronic product to gradually increase the output voltage value; and during the process, the control module detects the input voltage value, the input current value and the output voltage value, calculates the input power, and stores the output voltage value and the input power corresponding thereto; and then the control module controls the power module according to the output voltage value, which corresponds to the minimum input power of the stored input powers to make the output voltage value of the output end be the optimum voltage value. By aforementioned technology means, the present invention may solve the problem in the prior art, and achieve technical efficiency in reducing waste heat and saving energy costs.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A smart power supply system, comprising:
   an input end, connected to a power source and used to supply power;
   a power module, connected to the input end;
   an output end, connected to the power module; and
   a control module, connected to the input end, the power module, and the output end, used to receive the power to receive an application voltage range from an electronic product, and control the power module according to the application voltage range to make an output voltage value of the output end increasing gradually from a minimum voltage of the application voltage range to a maximum voltage of the application voltage range;
   wherein, in a process that the output voltage value of the output end is increased gradually from low to high, the control module detects an input voltage value and an input current value of the input end and the output voltage value of the output end to calculate an input power correspondingly, and sequentially stores the output voltage value and the input power corresponding thereto; and after the output voltage value of the output end is the maximum of the application voltage range and the control module stores the output voltage value and the input power corresponding thereto, the control module controls the power module according to the output voltage value, which corresponds to the minimum input power of the stored input power to make the output voltage value of the output end be an optimum voltage value.

2. The smart power supply system according to claim 1, wherein the control module is further used to detect whether the smart power supply system connects to the electronic product or not; and if the control module detects that the smart power supply system connects to the electronic product, the control module further detects whether the electronic product has an information transmission interface or not; and if the control module detects that the electronic product has the information transmission interface, the control module receives the application voltage range from the electronic product via the information transmission interface.

3. The smart power supply system according to claim 1, wherein when the smart power supply system connects to the electronic product, the electronic product transmits the application voltage range thereof to the control module.

4. The smart power supply system according to claim 1, wherein the control module includes a primary control submodule, a digital isolator, and a secondary control submodule, the primary control submodule is used to detect the input voltage value and the input current value of the input end, and control the power module to further control the output voltage value of the output end, the secondary control submodule is used to detect the output voltage value of the output end, and transmit the application voltage range from the electronic product to the digital isolator, and after the digital isolator digitizes the application voltage range, the digital isolator transmits the digitized application voltage range to the primary control submodule.

5. The smart power supply system according to claim 1, wherein the smart power supply system includes a protection module, connecting to the power module and the control module, and when the protection module detects that the power module is in an abnormal state, the protection module transmits an abnormal signal to the control module to make the control module shut down the power module for a certain period of time, and after the certain period of time has elapsed, the protection module detects whether the power module is still in the abnormal state; and if yes, the protection module transmits the abnormal signal to the control module again, so that the control module shuts down the power module for another certain period of time; and if not, the protection module transmits a recovery signal to the control module to make the control module turn on the power module, so that the smart power supply system supplies power to the electronic product.

6. A smart power supply method, comprising:
   providing a smart power supply system, including an input end, a power module, an output end, and a control module, wherein the input end connects to the power module, the power module connects to the output end, and the control module connects to the input end, the power module, and the output end;
   connecting the input end to a power source to supply power to the control module;
   receiving, by the control module, an application voltage range from an electronic product, and controlling the power module according to the application voltage range to make an output voltage value of the output end increased gradually from a minimum voltage of the application voltage range to a maximum voltage of the application voltage range;
   detecting, by the control module, an input voltage value and an input current value of the input end and the output voltage value of the output end to calculate an input power correspondingly, and sequentially storing, by the control module, the output voltage value and the input power corresponding thereto in the process that the output voltage value of the output end is increased gradually from low to high; and
   controlling, by the control module, the power module according to the output voltage value, which corresponds to the minimum input power of the stored input power to make the output voltage value of the output end be an optimum voltage value, after the output voltage value of the output end being the maximum of the application voltage range and the control module storing the output voltage value and the input power corresponding thereto.

7. The smart power supply method according to claim 6, wherein the smart power supply method further comprises:

detecting, by the control module, whether the smart power supply system connects to the electronic product or not;

detecting, by the control module, whether the electronic product has an information transmission interface or not if the control module detecting that the smart power supply system connects to the electronic product; and receiving, by the control module, the application voltage range from the electronic product via the information transmission interface if the control module detecting that the electronic product has the information transmission interface.

8. The smart power supply method according to claim 6, wherein the smart power supply method further comprises: transmitting, by the electronic product, the application voltage range thereof to the control module when the smart power supply system connecting to the electronic product.

9. The smart power supply method according to claim 6, wherein the control module includes a primary control submodule, a digital isolator, and a secondary control submodule, the primary control submodule is used to detect the input voltage value and the input current value of the input end, and control the power module to further control the output voltage value of the output end, the secondary control submodule is used to detect the output voltage value of the output end, and transmit the application voltage range from the electronic product to the digital isolator, and after the digital isolator digitizes the application voltage range, the digital isolator transmits the digitized application voltage range to the primary control submodule.

10. The smart power supply method according to claim 6, wherein the smart power supply system includes a protection module, connecting to the power module and the control module, and the smart power supply method further comprises:

transmitting, by the protection module, an abnormal signal to the control module to make the control module shut down the power module for a certain period of time when the protection module detecting that the power module is in an abnormal state;

detecting, by the protection module, whether the power module is still in the abnormal state after the certain period of time having elapsed;

if yes, transmitting, by the protection module, the abnormal signal to the control module again, so that the control module shutting down the power module for another certain period of time; and if not, transmitting, by the protection module, a recovery signal to the control module to make the control module turn on the power module, so that the smart power supply system supplying power to the electronic product.

* * * * *